United States Patent [19]

Yamaguchi et al.

[11] 4,233,668
[45] Nov. 11, 1980

[54] METHOD AND APPARATUS FOR TESTING A MAGNETIC BUBBLE MEMORY

[75] Inventors: Nakahiko Yamaguchi, Sayama; Susumu Hibi, Fujisawa; Shigeru Yoshizawa, Tokorozawa; Shoji Yoshimoto; Akira Kobayashi, both of Mobara, all of Japan

[73] Assignees: Nippon Telegraph and Telephone Public Corporation; Hitachi, Ltd., both of Japan

[21] Appl. No.: 946,864

[22] Filed: Sep. 29, 1978

[30] Foreign Application Priority Data

Sep. 30, 1977 [JP] Japan .............................. 52-117929

[51] Int. Cl.³ ........................................... G11C 19/08
[52] U.S. Cl. ......................................... 365/1; 324/210
[58] Field of Search ........................... 365/1, 15, 201; 324/34 MC, 210, 211, 212

[56] References Cited

U.S. PATENT DOCUMENTS

| 3,460,109 | 8/1969 | Veneziano | 365/201 |
| 4,061,908 | 12/1977 | de Jonge | 365/201 |

OTHER PUBLICATIONS

IEEE Transaction on Magnetics–vol. Mag-11, No. 6, Nov. 1975, pp. 1685-1688.
Electronics–"Bubble Memories Demand Unique Test Methods" by Bisset et al., May 10, 1979, pp. 117-122.
Electronics–"Tester for Bubble Memories First in Field" by R. Brownstein, Apr. 26, 1979, pp. 167-168.

*Primary Examiner*—James W. Moffitt
*Attorney, Agent, or Firm*—Craig & Antonelli

[57] ABSTRACT

Method and apparatus for testing a magnetic bubble memory are disclosed wherein a most severe magnetic bubble domain arrangement which fully causes the ununiformity of magnetic interaction between magnetic bubble domains is experimentally determined, and a basic pattern [P] and a test information pattern determining an arrangement of the basic patterns [P] and complementary patterns [P̄] thereof for realizing that magnetic bubble domain arrangement are stored in memory units, respectively, and the basic patterns [P] and the complementary patterns [P̄] are sequentially read out in accordance with the test information pattern to generate magnetic bubble domain trains in a storage area of the magnetic bubble memory. The magnetic bubble domain trains are then read out by a magnetic bubble detector and the read-out signals are converted to logical signals by a sense amplifier unit and the logical signals are synchronized with logical signals corresponding to the test information pattern and compared therewith to produce an identity or non-identity signal and thus the disclosed method and apparatus for testing the magnetic bubble memory can exactly evaluate a memory characteristic of the magnetic bubble memory.

9 Claims, 9 Drawing Figures

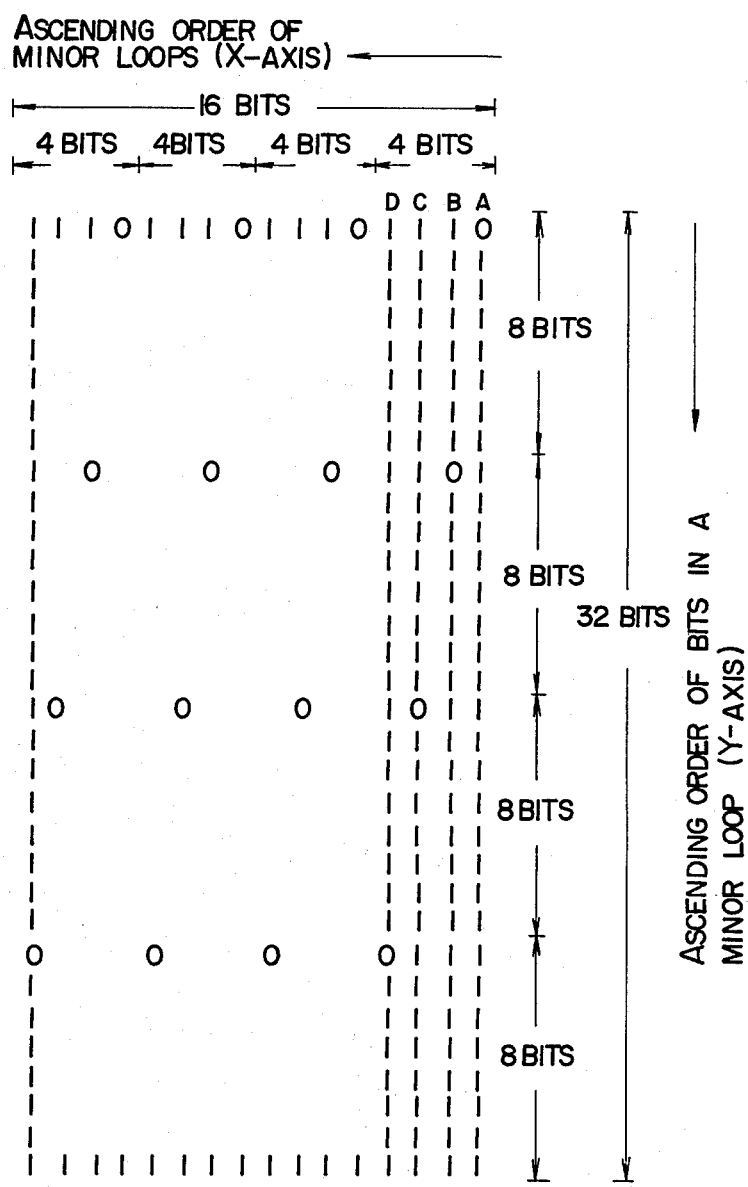

FIG. 5 ASCENDING ORDER OF MINOR LOOPS
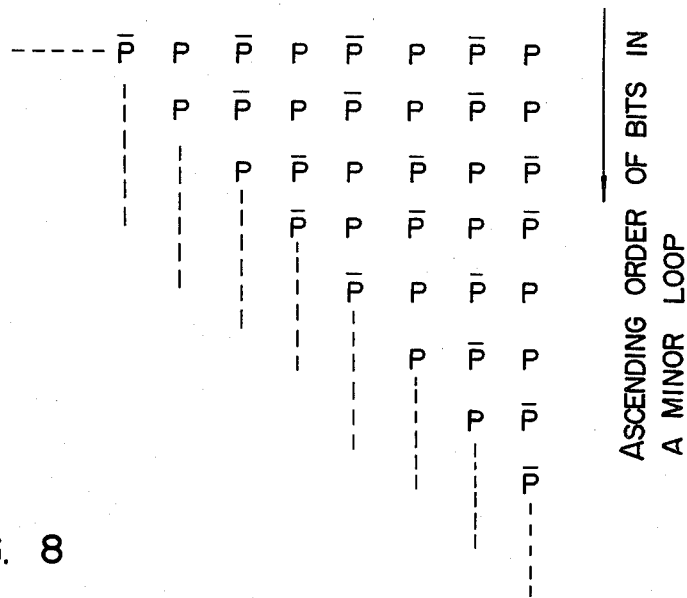
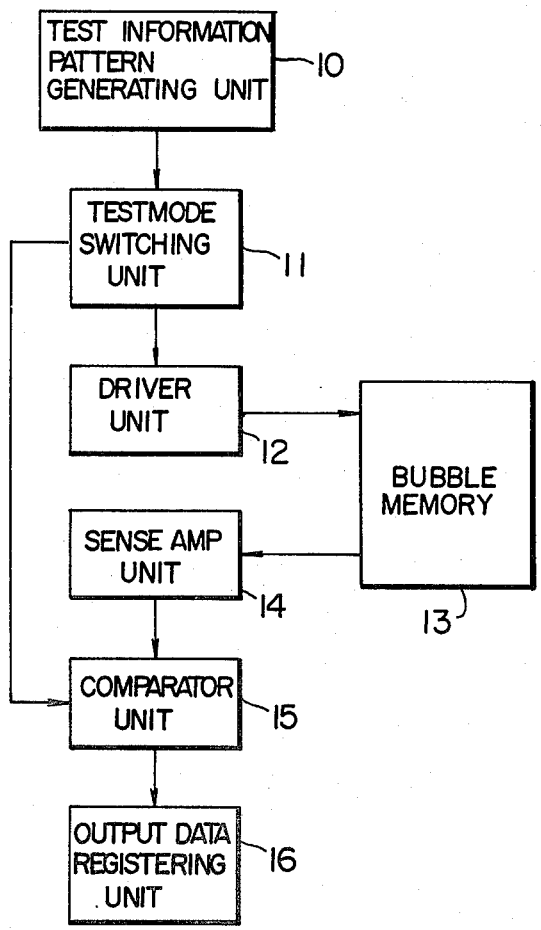
FIG. 8
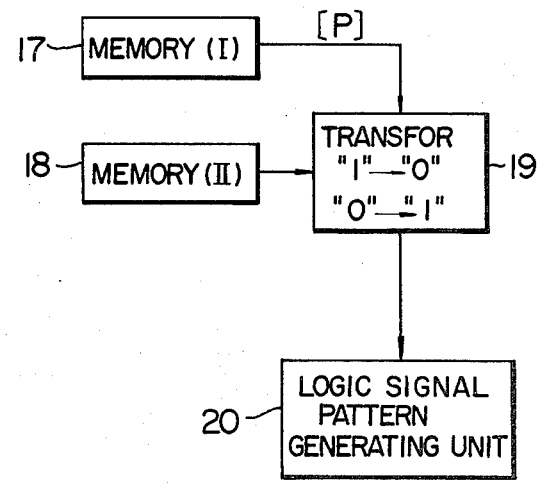
FIG. 9

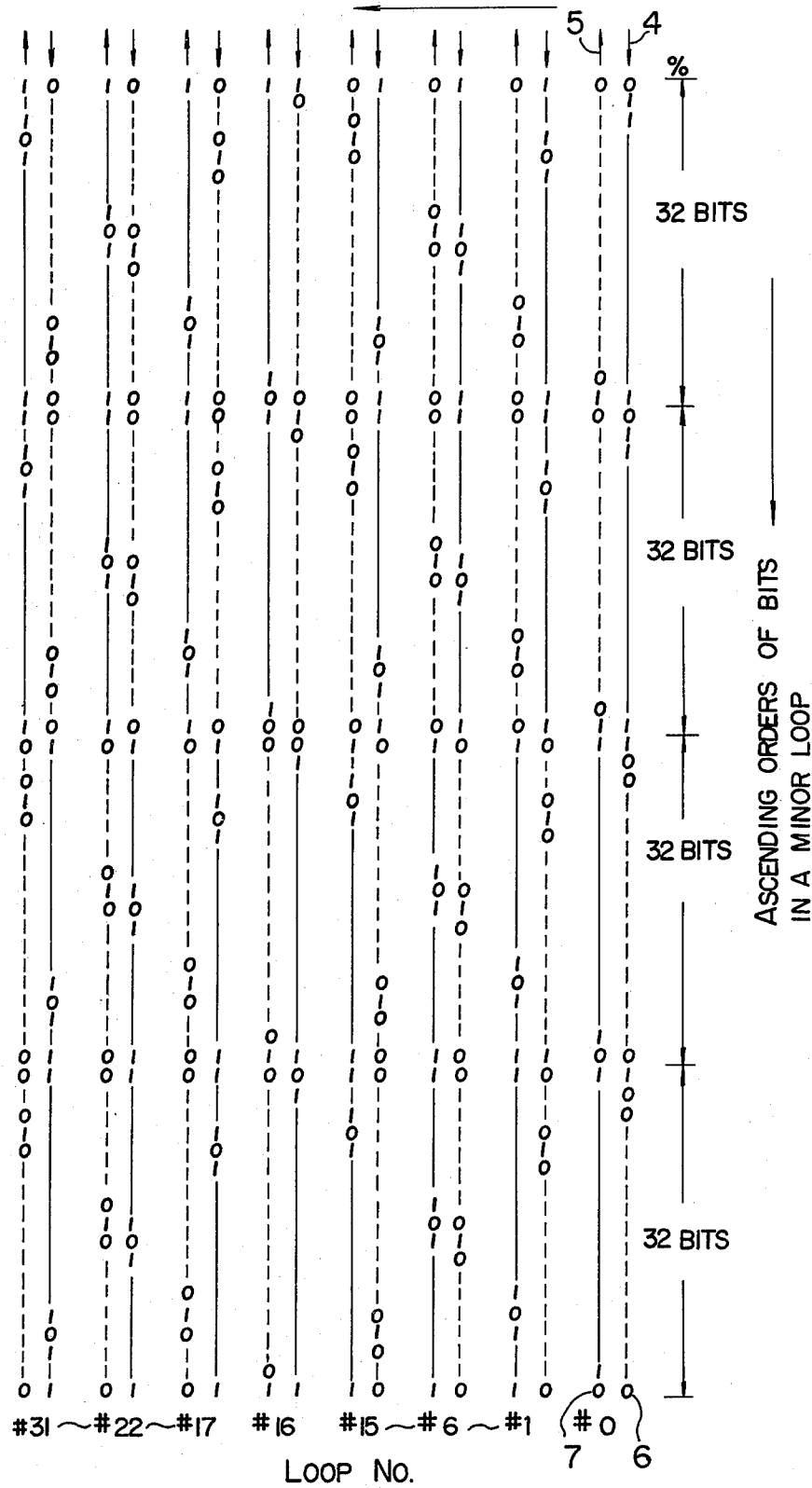

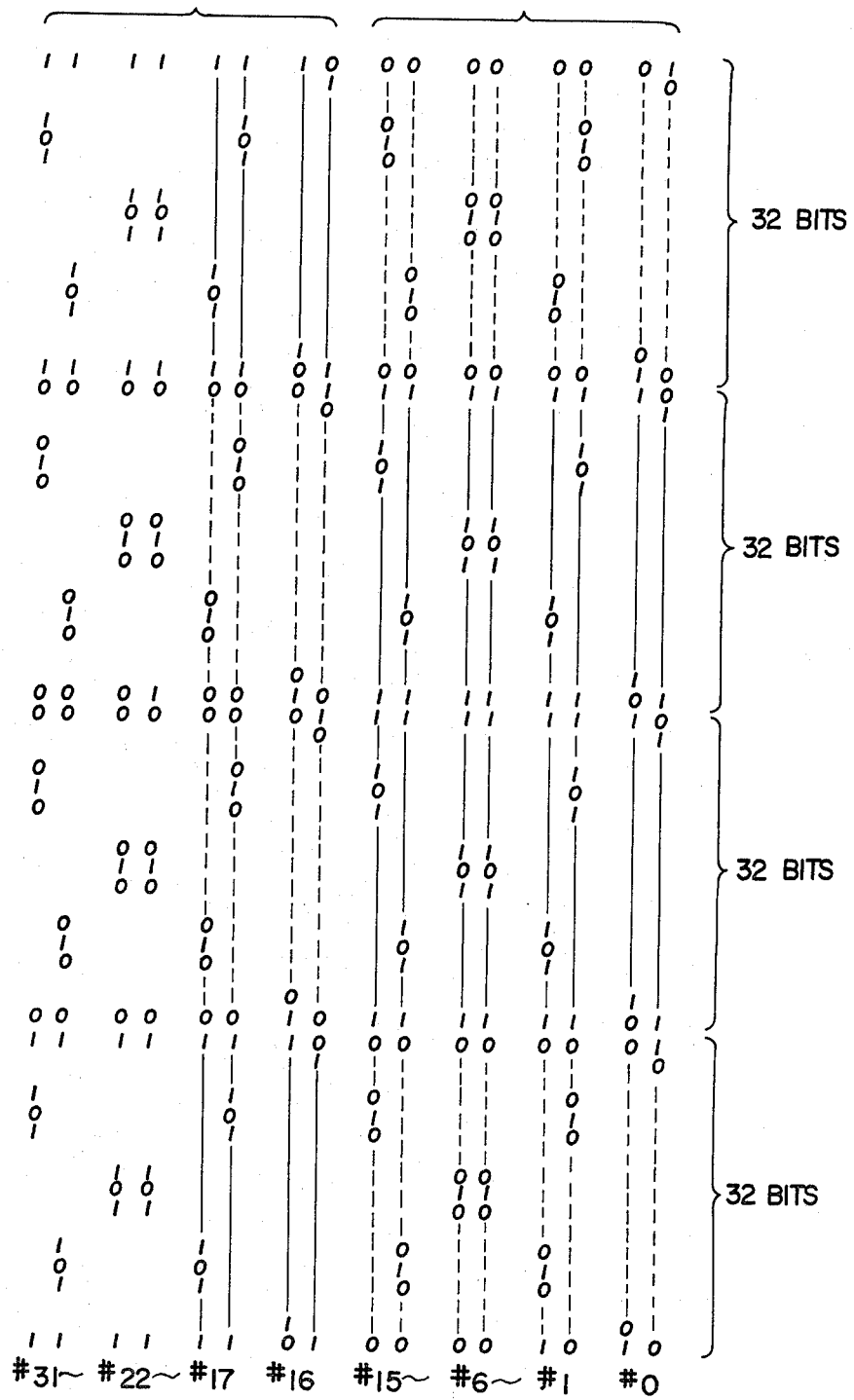

METHOD AND APPARATUS FOR TESTING A MAGNETIC BUBBLE MEMORY

BACKGROUND OF THE INVENTION

1. Field of the Invention

The present invention relates to a method and apparatus for testing a magnetic bubble memory, and more particularly to a testing method and apparatus which utilizes a test information pattern written into a storage area of a magnetic bubble memory chip.

2. Description of the Prior Art

It has been well known that in a single crystal thin film such as a certain type of rare earth garnet or orthoferrite, when an easy axis of magnetization is formed perpendicular to a plane of the film, circular magnetic domains (referred to as magnetic bubble domains) are generated by the application of a magnetic field in the direction of the easy axis of magnetization (referred to as a bias magnetic field), and that a magnetic bubble memory can be constructed by providing means for moving the magnetic bubble domains in the plane of the film. The magnetic bubble memory has been recently researched for actual implementation. In general, in a presently available magnetic bubble memory, the diameter of the magnetic bubble domain is equal to 1–5 $\mu$m and total of 16,000–1,000,000 magnetic bubble domains are held on a 3 to 6 mm square chip. Those magnetic bubble domains are positioned in stationary fashion by a geometrically arranged pattern of soft magnetic material thin film such as permalloy and they can be regularly transferred between columns of the pattern of the soft magnetic thin film by externally applying a rotating magnetic field in the plane of the film by the moving means. FIG. 1 shows a diagram of what is called a serial memory organization in which a closed loop 1 is constructed by the pattern of the soft magnetic thin films for regularly transferring the magnetic bubble domains. FIG. 2 shows another organization which is referred to as a major/minor loop memory organization in which a plurality of closed minor loops 2 are constructed by the patterns of the soft magnetic thin films and a closed major loop 3 for performing a common function is arranged adjacent to the closed loops 2.

The latter system comprises the minor loops 2 being used to store information therein and the major loop 3 being used to read and write the information. Satisfactory performance for a memory device requires that it be able to conduct write, store, and read operations of information without erroneous operation, to produce the characteristic of high precision at high speed. Such memory performance is directly or indirectly influenced by physical phenomena dependent on memory function, material to be used and the method of fabricating the memory device.

Since the magnetic bubble domains in a storage area carry an information "1" or "0" for each bubble domain, and are arranged at a given interval as closely as possible to each other in order to achieve a magnetic bubble domain density, which is called a "linked-bubble pattern," or "linked pattern," magnetic interactions are created among the magnetic bubble domains, as a matter of course although they are limited to a practical extent. In certain cases, such interactions impede proper transfer of the magnetic bubble domains.

This is one of the important factors which influence a memory characteristic such as that noted above. In order to evaluate such a memory characteristic, it is important to consider the dependency of a bias margin characteristic on the magnetic bubble domain arrangement, that is, the difference of influence of interaction between, at an upper limit, when the bias magnetic field applied to form the magnetic bubble domains (referred to as an upper limit of bias magnetic field) is increased and, at a lower limit, (referred to a lower limit of bias magnetic field) when the bias magnetic field is decreased, and also to consider the dependency on the linked pattern previously discussed by which the magnetic bubble domains are arranged in the storage area. The worst condition of the linked pattern of the magnetic bubble domains, that is, the condition which results in the largest magnetic interaction is especially important. In other words, the memory characteristic under the worst condition is most important to consider.

In testing such memory characteristics, a simple pattern such as a mode in which the magnetic bubble domains are arranged at all locations (referred to as an all "1's" pattern) or a mode in which no magnetic bubble domain is arranged at all locations (referred to as an all "0's" pattern) has been used, but as mentioned above, none of them individually realizes the worst condition for both upper and lower limits of bias magnetic field when taking the interaction among the magnetic bubble domains into consideration. Namely, the test has a drawback that it cannot exactly evaluate the memory characteristic.

SUMMARY OF THE INVENTION

It is an object of the present invention to provide a method and apparatus for simply and exactly evaluating the memory characteristic of the magnetic bubble memory. More particularly, it is a first object of the present invention to provide a method for testing the magnetic bubble memory by utilizing a magnetic bubble domain arrangement pattern which realizes a worst condition magnetic bubble domain arrangement pattern. It is a second object of the present invention to provide an apparatus for testing the memory performance of the magnetic bubble memory comprising a circuit device for generating a magnetic bubble arrangement pattern to the storage area of the magnetic bubble memory with a worst condition, a signal input circuit device for introducing said pattern in the storage area; a signal output circuit device for deriving the pattern as electrical signal pattern after the pattern is circulated once or plural times, and a comparing circuit for comparing said electrical signal pattern with the magnetic bubble arrangement pattern input with worst condition.

According to one aspect of the present invention, there is provided a method for testing the magnetic bubble memory comprising the steps of storing a basic pattern [P] represented by binary notation in a first memory unit and storing a test information pattern determining the arrangement of the basic patterns [P] and complementary patterns [P̄] thereof in a second memory unit; sequentially reading the basic patterns [P] and the complementary patterns [P̄] in accordance with the test information pattern; converting those patterns into logical signals corresponding to the binary notation and then producing a magnetic bubble pattern corresponding to the test information pattern in a storage area of the magnetic bubble memory by a driver through a test mode switching unit; converting magnetic bubble domain trains of the magnetic bubble pattern into logical signals through a magnetic bubble domain detector unit and an output amplifier unit; comparing the logical signals corresponding to the magnetic bubble domain trains with the logical signals corresponding to the test information pattern by a comparator unit to determine identity or non-identity thereof; and evaluating a memory characteristic of the magnetic bubble memory by an output of the comparator unit.

In accordance with another aspect of the present invention, there is provided an apparatus for testing memory performance of a magnetic bubble memory comprising: a first memory unit for storing a basic pattern [P]; a second memory unit for storing a test information pattern consisting of the basic patterns and complementary patterns [P̄] which determines an order of transmission for [P] and [P̄]; a logical signal pattern generating unit for generating logical signals in accordance with the test information pattern stored in the second memory unit; a driver unit for writing a magnetic bubble pattern corresponding to the logical signal pattern in a storage area of the magnetic bubble memory through a test mode switching unit which switches the logical signals to a test mode; a detector unit for detecting said magnetic bubble pattern after it is circulated; an amplifier unit for converting an electrical signal from the detector unit into a logical signal; a comparator unit for comparing said logical signal from said detector unit with said logical signal supplied through said test mode switching unit from said logical signal pattern generating unit; and a register unit for registering identity or non-identity of said logical signals. The basic pattern includes "0" information in at least one bit position in a first n-bit minor loop in said storage area and "1" information at remaining bit positions, and including "0" information at a stationary bit position in a second minor loop which is adjacent to said first minor loop, said stationary bit position in said second minor loop being displaced by l-bit positions from the "0" information bit position in said first minor loop, and including "0" information at bit positions in third to m-th minor loops each of which bit positions is displaced by l-bit positions from the bit position in the preceding minor loops, said complementary pattern [P̄] being a complementary pattern to said basic pattern [P], that is, "1" information bits and "0" information bits in said basic pattern [P] having been replaced with "0" information bits and "1" information bits, respectively, in said complementary pattern [P̄]. The storage area of the magnetic bubble memory includes a plurality of rectangularly arranged planes each comprising m minor loops each consisting of 2×n bits, as a transfer path comprising a magnetic thin film for generating and maintaining magnetic bubble domains and soft magnetic material thin films arranged on said magnetic thin film.

BRIEF DESCRIPTION OF THE DRAWINGS

FIG. 4 shows a basic pattern arrangement illustrating one embodiment of a basic pattern [P] in accordance with the present invention;

FIG. 5 shows an arrangement of one embodiment of a test information pattern determining an arrangement of the basic patterns [P] and complementary patterns [P̄] thereof, to be used in the method for testing the magnetic bubble memory in accordance with the present invention;

FIG. 6 shows a configuration of a magnetic bubble pattern in which an information pattern for testing a margin characteristic to be used in the method for testing the magnetic bubble memory in accordance with the present invention is developed;

FIG. 7 shows a configuration of a magnetic bubble pattern in which the information pattern for testing the margin characteristic to be used in the method for testing the magnetic bubble memory in accordance with the present invention is developed with each bit being shifted by 32 bit positions in ascending order of bits in a minor loop;

FIG. 8 is a block diagram of an apparatus for testing the magnetic bubble memory in accordance with the present invention; and FIG. 9 is a block diagram of the test information pattern generating unit shown in FIG. 8.

DETAILED DESCRIPTION OF THE PREFERRED EMBODIMENTS

Before describing the preferred embodiments of the present invention, the results of experiments by the inventors of the present invention are briefly explained.

Figure 1:
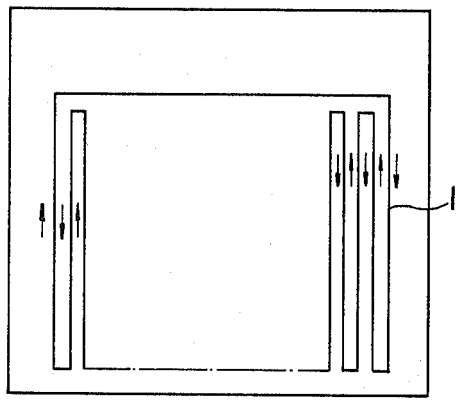
FIG. 1 is a diagram illustrating a configuration of a serial memory organization of a magnetic bubble memory.
Figure 2:
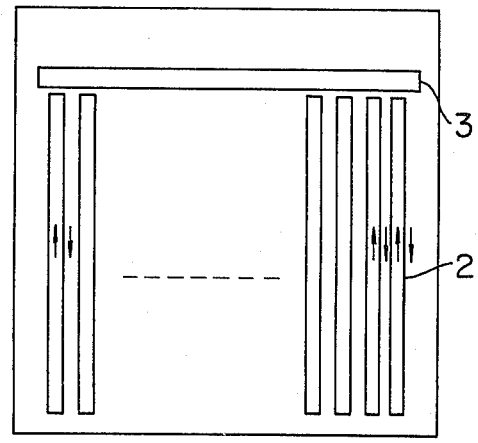
FIG. 2 is a diagram illustrating a configuration of a major/minor loop organization.
Figure 3:
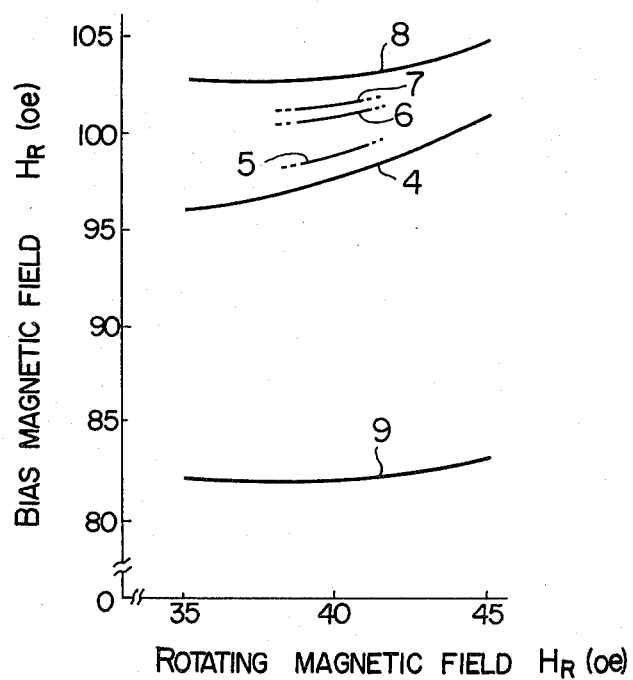
FIG. 3 shows a measurement result of margin characteristic curves of a magnetic bubble memory in a plane of the major/minor loop organization.

FIG. 3 shows curves which are measurements of a margin characteristic when the magnetic bubble domains are arranged in a given manner. A curve 4 shows an upper limit curve for 128 loops on a magnetic bubble domain plane in which only a specified bit position bear "0" information and all other bit positions bear "1" information. Curve 5 shows an upper limit curve on a magnetic bubble domain plane in which for each 16 loops only a specified bit position bears "0" information and all other bit positions bear "1" information. Curve 6 shows an upper limit curve on a magnetic bubble domain plane in which for each two loops similar information pattern is arranged. Curve 7 shows an upper limit curve on a magnetic bubble domain plane in which for each loop similar information pattern is arranged. Curve 8 shows an upper limit curve on a magnetic bubble domain plane in which for each loop only a specified bit position bears "1" information and all other bit positions bear "0" information. A curve 9 shows a lower limit curve when a specified loop bears a single "1" information. It is seen that the curve 4 in which the "0" information bit is fully surrounded by "1" information bits for 128 loops as the upper limit curve is in the worst or most severe condition, and the condition is relieved as the number of the surrounding "1" information bits decreases (in the sequence of the curves 5, 6, 7, 8).

In general, an upper limit and lower limit of a bias magnetic field are used to evaluate the memory characteristic of the magnetic bubble memory. From the consideration of the cause of variation of those limits, it is seen that an interaction between the magnetic bubble domains functions to extinguish the magnetic bubble domains because the interaction functions to create a magnetic field in opposite direction to the domain magnetization.

From the above, it can be readily guessed that the higher the number of surrounding magnetic bubble domains, the more the upper limit of the bias magnetic field is lowered. Conversely, it is apparent that if there is no surrounding magnetic bubble domain, the lower limit of the bias magnetic field is highest, that is, in the worst condition. This shows that a worst condition test can be performed in evaluating the memory characteristic of the magnetic bubble memory by using all "1's" information pattern for testing the upper limit of the bias magnetic field and using an information pattern which includes only one "1" magnetic bubble domain in all "0's" pattern for testing the lower limit.

It is preferable to generate an information pattern within a range to allow magnetic disturbance to be effectively imparted to a stationary position of a magnetic bubble domain in question.

In other words, it is preferable to sequentially generate such an information pattern for each magnetic bubble domain. In this manner, the memory characteristic at each static position can be evaluated.

An embodiment of the method for testing a magnetic bubble memory in accordance with the present invention is now explained in conjunction with the drawings.

FIG. 4 shows an example of an information basic pattern used for testing the magnetic bubble memory in accordance with the present invention.

It shows an information pattern on a $m \times n = 16 \times 32 = 512$ bits plane, in which 32-bit information patterns each written continuously in one minor loop are shown in vertical columns (Y-axis) while an abscissa (X-axis) represents 16 adjacent minor loops. Each of the 32-bits vertical columns (Y-axis) consists of 31 "1" information bits and one "0" information bit. The bit position of the "0" information bit in each column is shifted by $l=8$-bits positions with respect to its preceding column as viewed in the direction of X-axis.

This basic pattern is represented by [P] and a complementary pattern thereof (in which "1" and "0" in the pattern [P] have been replaced by "0" and "1," respectively) is represented by [P̄]. The present invention uses a test information pattern determining the arrangement the basic patterns [P] and the complementary patterns [P̄]. FIG. 5 shows an example thereof. FIG. 6 shows a whole pattern of the magnetic bubble domains in the storage area developed in the ascending order of the minor loops and the ascending order of the bits in the minor loop shown in FIG. 5. Since each minor loop consists of a pair of adjacent magnetic bubble domain trains, those magnetic bubble domain trains are moved in the directions shown by arrows 4 and 5, respectively, by a rotating magnetic field. Of course, the information pattern in a vertical train 6 and the information pattern in a vertical train 7 represent portions of a series of patterns in the bit direction in one minor loop. When the bits in FIG. 6 are shifted by 32-bit positions by the rotating magnetic field, a pattern configuration as shown in FIG. 7 is generated.

This pattern configuration is very important in the present invention. In this pattern configuration, the magnetic bubble domain area is divided into $32 \times 32$-bits groups each of which is either almost all "1's" group or almost all "0's" group. Thus, it includes both the worst pattern for the upper limit of the bias magnetic field and the worst pattern for the lower limit. It is apparent that, as the bits are transferred by the rotating magnetic field, the patterns are sequentially moved so that both types of worst condition patterns alternately appear over the entire magnetic bubble domain area. It is thus apparent that the memory characteristic of the magnetic bubble memory can be exactly evaluated by the test information pattern used for testing the magnetic bubble memory in accordance with the present invention.

The basic pattern configuration shown in FIG. 5 is a mere example, and the same effect can be attained by any configuration in which the basic pattern [P] and the complementary pattern [P̄] repeat in a predetermined relation. Similarly, it should be understood that the principal subject matter of the present invention remains unchanged if the basic pattern shown in FIG. 4 is changed from $16 \times 32$ pattern to $2 \times 4$ through $64 \times 128$ patterns or the like. Furthermore, the number "8" when the "0" pattern is shifted by 8 bits in the adjacent loop need not be fixed but the number may be selected freely depending on the overall structure of the storage area.

FIG. 8 shows one embodiment of a configuration of a test apparatus for testing the magnetic bubble memory using the test information pattern described above.

In FIG. 8, numeral 10 denotes a test information pattern generating unit, 11 a test mode switching unit, 12 a magnetic bubble domain driver unit, 13 a magnetic bubble memory, 14 a sensing amplifier unit, 15 a comparator unit, and 16 an output data register unit. The test information pattern generating unit 10 is explained in more detail in the block diagram of FIG. 9. Numeral 17 designates a first memory unit for storing the basic pattern [P], 18 a second memory unit for storing the test information pattern, 19 a transfer unit for replacing "1" information by "0" information, vice versa and 20 a logical signal pattern generating unit for generating logical signals according to the test information pattern. Namely, the logical signal pattern generating unit 20 receives the logical signal train corresponding to the basic pattern [P] or the complementary pattern thereof [P̄] in accordance with the instructions from the secod memory unit 18. In this case, when the complementary patter [P̄] is designated by the second memory unit 18, "1" information is replaced by "0" information in the transfer unit 19 and then the logical signal train thereof is transmitted to the logical signal pattern generating unit 20.

An information pattern for each minor loop address generated by the test information pattern generating unit 10 is supplied to the test mode switching unit 10 in the form of a logical signal train. When a branch "WRITE" is selected in the test mode switching unit 11, the logical signal train of the information pattern is supplied to the magnetic bubble domain driver unit 12 and converted into a magnetic bubble domain train by a magnetic bubble domain generating unit (not shown) provided on the magnetic bubble memory 13. The magnetic bubble domain train for each minor loop address is temporarily serially stored in a major loop and when it reaches a predetermined minor loop position, it is transferred to that minor loop in parallel. As the magnetic bubble domain train for each minor loop address is sequentially transferred, the bit positions in all of the minor loops are filled with the magnetic bubble domains. After the storage area of the magnetic bubble memory has been filled, the magnetic bubble domain train for one minor loop address is taken through the major loop and supplied to a magnetic bubble detector (not shown) in serial. The magnetic bubble domain detector serially detects the magnetic bubble domain train to be read out as an analog signal, which is then converted to a logical signal by the sense amplifier unit 14, thence it is supplied to a comparator unit 15.

Under this condition, when a branch "READ" is selected in the test mode switching unit 11, the logical signal train from the test information pattern generating unit 10 is compared with the logical signal train from the magnetic bubble memory 13 corresponding to the magnetic bubble domains for one minor loop address, in the comparator unit 15, which produces a "YES" signal when they are identical and a "NO" signal when they are not identical. The output signal is registered in the output data register unit 16.

The units shown in FIG. 8 issue operation commands in accordance with the hardware configuration shown in FIG. 8 and the test information pattern described above is applied to the magnetic bubble memory under test, compared with the read-out information pattern, and the comparison result is read out within a predetermined time period.

As is apparent from the above, the present method and apparatus for testing the magnetic bubble memory can exactly evaluate the memory characteristic of the magnetic bubble memory and greatly contribute to the development of the magnetic bubble memory which has recently been noted as a practical and important application of the magnetic bubble devices to take place of a mechanical file memory.

We claim:

1. A method for testing a magnetic bubble memory comprising the steps of:
    storing a basic pattern [P] represented by binary notation in a first memory unit and storing a test information pattern for determining an arrangement of said basic patterns [P] and complementary patterns [P̄] thereof in a second memory unit;
    sequentially reading said basic pattern [P] and said complementary pattern [P̄] in accordance with said test information pattern;
    converting said patterns into a logical signal corresponding to binary notation;
    generating a magnetic bubble pattern corresponding to said test information pattern in a storage area of said magnetic bubble memory by a driver unit through a test mode switching unit;
    converting a magnetic bubble domain train of said magnetic bubble pattern into a logical signal by a magnetic bubble domain detector and an output amplifier unit;
    comparing said logical signal corresponding to said magnetic bubble domain train with said logical signal corresponding to said test information pattern by a comparator unit to determine identity or non-identity thereof; and
    evaluating a memory characteristic of said magnetic bubble memory by the output from said comparator unit.

2. A method for testing the magnetic bubble memory according to claim 1 wherein said magnetic bubble memory includes a plurality of rectangularly arranged planes each comprising m minor loops each consisting of 2×n bits comprising a magnetic thin film for generating and maintaining magnetic bubble domains and soft magnetic material thin films arranged on said magnetic thin film, said test information pattern is stored in the storage area of said magnetic bubble memory and used to evaluate the memory characteristic at a stationary position of the magnetic bubble domain in said storage area, said basic pattern [P] includes "0" information at at least one bit position of a first n-bit minor loop and "1" information at remaining bit positions in that loop, and includes "0" information at a bit position in a second minor loop which is adjacent to said first minor loop, said bit position in said second minor loop being displaced by l-bit positions from the "0" information bit position in said first minor loop, and includes "0" information in bit positions in third to m-th minor loops each of which bit positions is displaced by l-bit positions from the bit position in the preceding minor loop, and said complementary pattern [P̄] is a complementary pattern to said basic pattern, that is, "1" information bits and "0" information bits in said basic pattern [P] have been replaced by "0" information bits and "1" information bits, respectively, in said complementary pattern [P̄].

3. A method for testing a magnetic bubble memory according to claim 2 wherein said rectangularly arranged test information pattern determining an arrangement of said basic patterns [P] and said complementary patterns [P̄] in said storage area includes the same pattern which appears one for every other pattern as viewed in the direction of ascending order of the minor loops and one for every two patterns as viewed in the direction of ascending order of bits in a minor loop.

4. A method for testing a magnetic bubble memory according to claim 2 wherein said test information pattern includes the basic patterns [P] and the complementary patterns [P̄] thereof, in which n=32, m=16 and l=8.

5. A method for testing a magnetic bubble memory according to claim 4 wherein said rectangularly arranged test information pattern determining an arrangement of said basic patterns [P] and said complementary patterns [P̄] in said storage area includes the same pattern which appears one for every other pattern as viewed in the direction of ascending order of the minor loops and one for every two patterns as viewed in the direction of ascending order of bits in a minor loop.

6. A test apparatus for a magnetic bubble memory including a plurality of rectangularly arranged planes each comprising m minor loops each consisting of 2×n bits comprising a magnetic thin film for generating and maintaining magnetic bubble domains and soft magnetic material thin films arranged on said magnetic thin film, using a test information pattern stored in a storage area of said magnetic bubble memory, said test information pattern determining an arrangement of basic patterns [P] and complementary patterns [P̄] thereof, said basic pattern including "0" information at at least one bit position in a first n-bit minor loop in said storage area and "1" information at remaining bit positions, and including "0" information at a stationary bit position in a second minor loop which is adjacent to said first minor loop, said stationary bit position in said second minor loop being displaced by l-bit positions from the "0" information bit position in said first minor loop, and including "0" information at bit positions in third to m-th minor loops each of which bit positions is displaced by l-bit positions from the bit position in the preceding minor loops, said complementary pattern [P̄] being a complementary pattern to said basic pattern [P], that is, "1" information bits and "0" information bits in said basic pattern [P] having been replaced with "0" information bits and "1" information bits, respectively, in said complementary pattern [P̄];
    said apparatus comprising;
    a first memory unit for storing said basic pattern [P],
    a second memory unit for storing said complementary pattern [P̄] which is generated from a transfer unit which transfers "1" information bits and "0" information bits in said basic pattern [P] to "0"

information bits and "1" information bits, respectively, a logical signal pattern generating unit for generating a logical signal from said first memory unit which stores said basic pattern [P] and said transfer unit in accordance with an instruction of said test information pattern stored in said second memory unit, a driver unit for generating a magnetic bubble pattern corresponding to said logical signal pattern in said storage area of said magnetic bubble memory in a magnetic bubble chip through a test mode switching unit for switching said logical signal to a test mode, an amplifier unit for converting an electric signal from a detecter unit in said magnetic bubble memory into a logical signal, a comparator unit for comparing said logical signal from said detector unit supplied through said test mode switching unit with said logical signal from said logical signal pattern generating unit, and a register unit for registering identity or non-identity of said logical signals.

7. A test apparatus for a magnetic bubble memory according to claim 6 wherein said rectangularly arranged test information pattern determining an arrangement of said basic patterns [P] and said complementary patterns [$\overline{P}$] in said storage area includes the same pattern which appears one for every other pattern as viewed in the direction of ascending order of the minor loops and one for every two patterns as viewed in the direction of ascending order of bits in a minor loop.

8. A test apparatus for a magnetic bubble memory according to claim 7 wherein said test information pattern determines an arrangement of the basic patterns [P] and the complementary patterns [$\overline{P}$] thereof, in which $n=32$, $m=16$ and $l=8$.

9. A test apparatus for a magnetic bubble memory according to claim 8 wherein said rectangularly arranged test information pattern determines an arrangement of said basic patterns [P] and said complementary patterns [$\overline{P}$] in said storage area includes the same pattern which appears one for every other pattern as viewed in the direction of ascending order of the minor loops and one for every two patterns as viewed in the direction of ascending order of bits in a minor loop.

* * * * *